(12) United States Patent
Wacyk et al.

(10) Patent No.: US 11,437,451 B2
(45) Date of Patent: Sep. 6, 2022

(54) LARGE AREA DISPLAY AND METHOD FOR MAKING SAME

(71) Applicant: eMagin Corporation, Hopewell Junction, NY (US)

(72) Inventors: Ihor Wacyk, Hopewell Junction, NY (US); Amalkumar P. Ghosh, Hopewell Junction, NY (US); Andrew G. Sculley, Jr., Hopewell Junction, NY (US); Olivier Prache, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 77 days.

(21) Appl. No.: 15/710,602

(22) Filed: Sep. 20, 2017

(65) Prior Publication Data
US 2018/0083081 A1    Mar. 22, 2018

Related U.S. Application Data

(60) Provisional application No. 62/398,329, filed on Sep. 22, 2016.

(51) Int. Cl.
| | |
|---|---|
| *H01L 27/32* | (2006.01) |
| *H01L 51/00* | (2006.01) |
| *H01L 23/00* | (2006.01) |
| *H01L 27/06* | (2006.01) |

(52) U.S. Cl.
CPC .......... *H01L 27/3255* (2013.01); *H01L 24/83* (2013.01); *H01L 27/326* (2013.01); *H01L 27/3276* (2013.01); *H01L 51/0096* (2013.01); *H01L 27/0629* (2013.01); *H01L 2224/83851* (2013.01); *H01L 2227/323* (2013.01); *H01L 2251/5353* (2013.01); *H01L 2924/1426* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 5,711,693 | A | 1/1998 | Nam et al. |
| 5,748,268 | A | 5/1998 | Kalmanash |
| 6,097,455 | A | 8/2000 | Babuka et al. |
| (Continued) | | | |

FOREIGN PATENT DOCUMENTS

| | | |
|---|---|---|
| CN | 202183373 U | 4/2012 |
| EP | 2830036 | 1/2015 |
| (Continued) | | |

OTHER PUBLICATIONS

"Final Office Action" issued in U.S. Appl. No. 15/697,372, dated Jun. 27, 2018.

(Continued)

*Primary Examiner* — Abul Kalam
(74) *Attorney, Agent, or Firm* — Kaplan Breyer Schwarz, LLP

(57) ABSTRACT

A large area active-matrix organic light-emitting diode microdisplay and method for fabricating the same is provided which includes a panel having resolution of greater than 2,000 pixels per inch and a size of 1.4 or more inches for supporting the needs of virtual reality and augmented reality application.

7 Claims, 4 Drawing Sheets

(56) References Cited

U.S. PATENT DOCUMENTS

| | | | |
|---|---|---|---|
| 6,498,692 | B1 | 12/2002 | Hassner et al. |
| 6,567,138 | B1 | 5/2003 | Krusius et al. |
| 6,624,570 | B1 | 9/2003 | Nishio et al. |
| 6,967,111 | B1 | 11/2005 | Hata |
| 7,129,634 | B2 | 10/2006 | Boronson et al. |
| 7,394,194 | B2 | 7/2008 | Cok |
| 7,583,279 | B2 | 9/2009 | Brown Elliott et al. |
| 8,177,335 | B2 | 5/2012 | Gerner et al. |
| 8,552,635 | B2 | 10/2013 | Kim et al. |
| 8,742,659 | B2 | 6/2014 | Chang |
| 8,796,740 | B1 | 8/2014 | Landis et al. |
| 8,816,331 | B2 | 8/2014 | Choi et al. |
| 9,123,266 | B2 | 9/2015 | Bastani et al. |
| 9,147,611 | B1 | 9/2015 | Landis et al. |
| 9,829,710 | B1 * | 11/2017 | Newell ............. G02B 27/0172 |
| 2002/0001026 | A1 | 1/2002 | Ishikawa et al. |
| 2002/0015110 | A1 | 2/2002 | Brown Elliott |
| 2002/0163301 | A1 | 11/2002 | Morley et al. |
| 2003/0160915 | A1 | 8/2003 | Liu |
| 2004/0195963 | A1 | 10/2004 | Choi et al. |
| 2005/0003633 | A1 | 1/2005 | Mahle et al. |
| 2005/0186717 | A1 | 8/2005 | Gyoda et al. |
| 2006/0033422 | A1 | 2/2006 | Chao et al. |
| 2006/0125506 | A1 | 6/2006 | Hara et al. |
| 2006/0284202 | A1 | 12/2006 | Nakane et al. |
| 2007/0024183 | A1 | 2/2007 | Lih et al. |
| 2007/0035239 | A1 | 2/2007 | Kang et al. |
| 2007/0108899 | A1 | 5/2007 | Jung et al. |
| 2007/0176859 | A1 | 8/2007 | Cok et al. |
| 2008/0001864 | A1 | 1/2008 | Lee et al. |
| 2009/0035518 | A1 | 2/2009 | Wang et al. |
| 2009/0115970 | A1 | 5/2009 | Morejon et al. |
| 2011/0220921 | A1 | 9/2011 | Tamura et al. |
| 2012/0006978 | A1 | 1/2012 | Ludwig |
| 2012/0206499 | A1 * | 8/2012 | Cok ..................... G09G 3/3208 345/690 |
| 2013/0208003 | A1 * | 8/2013 | Bohn .................... G09G 3/001 345/633 |
| 2014/0140019 | A1 * | 5/2014 | Park ....................... H05K 3/361 361/749 |
| 2014/0197379 | A1 | 7/2014 | Li |
| 2014/0313112 | A1 | 10/2014 | Madhusudan |
| 2015/0054719 | A1 | 2/2015 | Lee et al. |
| 2015/0116300 | A1 | 4/2015 | Yamaki et al. |
| 2015/0311269 | A1 | 10/2015 | Hsu et al. |
| 2015/0331508 | A1 * | 11/2015 | Nho ..................... G06F 3/0421 345/173 |
| 2016/0149165 | A1 | 5/2016 | Kim |
| 2016/0322434 | A1 | 11/2016 | Ghosh et al. |
| 2016/0329385 | A1 | 11/2016 | Qiu et al. |
| 2016/0343284 | A1 | 11/2016 | Sun |
| 2017/0075475 | A1 * | 3/2017 | Miyake ................. G06F 3/0416 |
| 2017/0194389 | A1 | 7/2017 | Guo et al. |
| 2017/0345370 | A1 * | 11/2017 | Hack .................... G09G 3/3258 |
| 2018/0083081 | A1 * | 3/2018 | Wacyk ............... H01L 27/3255 |

FOREIGN PATENT DOCUMENTS

| | | |
|---|---|---|
| WO | 2014043850 A1 | 3/2014 |
| WO | 2015/101328 A1 | 7/2015 |

OTHER PUBLICATIONS

"Office Action" issued in related U.S. Appl. No. 15/697,372, dated Mar. 7, 2018, 13 pp.

"Non-Final Office Action" issued in related U.S. Appl. No. 15/243,197, dated Sep. 28, 2017, 13 pp.

"Final Rejection" issued in related U.S. Appl. No. 15/243,197, dated May 7, 2018, 16 pp.

Authorized Officer: Eli Sarit, "International Search Report and Written Opinion" dated Aug. 8, 2016 in counterpart PCT Application No. PCT/US2016/030414, Publisher: PCT, Published in: Israel.

Eric F, "The Art of Making Large Image Sensors (or Quilting with Silicon)", "Imaging Blog", dated Feb. 7, 2012, Publisher: Teledyne Dalsa—http://blog.teledynedalsa.com/2012/02/the-art-of-making-large-image-sensors-or-quilting-with-silicon/. Published in: CA.

"Office Action", issued in related U.S. Appl. No. 15/144,142, dated Mar. 23, 2017.

"Office Action" issued in parent U.S. Appl. No. 15/243,197, dated Jul. 13, 2017.

Notice of Allowance and Fees Due (PTOL-85) received for U.S. Appl. No. 15/697,372, dated Jan. 7, 2019, 9 pages.

Non-Final Rejection received for U.S. Appl. No. 15/243,197, dated Mar. 21, 2019, 18 pages.

Final Rejection received for U.S. Appl. No. 15/243,197, dated Nov. 30, 2018, 17 pages.

Examiner initiated interview summary (PTOL-413B) received for U.S. Appl. No. 15/243,197, dated Jan. 28, 2019, 2 pages.

Applicant Initiated Interview Summary (PTOL-413) received for U.S. Appl. No. 15/697,372, dated Dec. 12, 2018, 4 pages.

Advisory Action (PTOL-303) received for U.S. Appl. No. 15/243,197, dated Jan. 28, 2019, 3 pages.

Non-Final Office Action received for U.S. Appl. No. 15/697,372, dated Sep. 20, 2018, 10 pages.

Non-Final Office Action received for U.S. Appl. No. 15/243,197, dated Aug. 6, 2018, 19 pages.

Annex to the communication dated May 12, 2020 for EP Application No. 16789891.

European Search Report and Search Opinion Received for EP Application No. 16789891.5, dated Dec. 19, 2018, 10 pages.

Final Rejection received for U.S. Appl. No. 15/243,197, dated Jul. 8, 2019, 19 pages.

Office Action received for European Application No. 16789891.5, dated Oct. 11, 2019, 4 pages.

Annex to the communication dated Feb. 18, 2021 for EP Application No. 16789891.

Communication about intention to grant a European patent dated Apr. 23, 2021 for EP Application No. 16789891.5.

Decision to grant a European patent dated May 28, 2021 for EP Application No. 16789891.5.

* cited by examiner

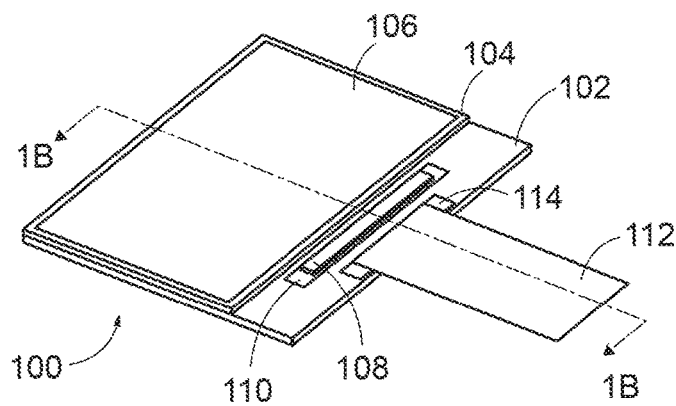
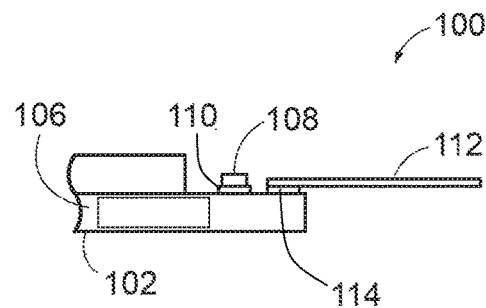
FIG. 1A
PRIOR ART
FIG. 1B
PRIOR ART
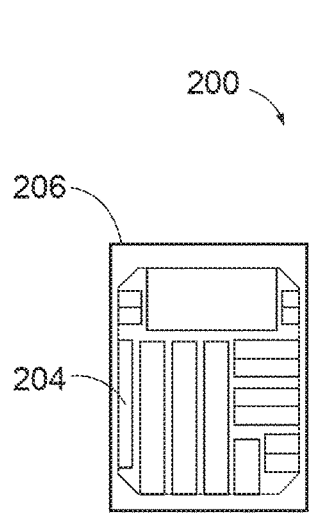
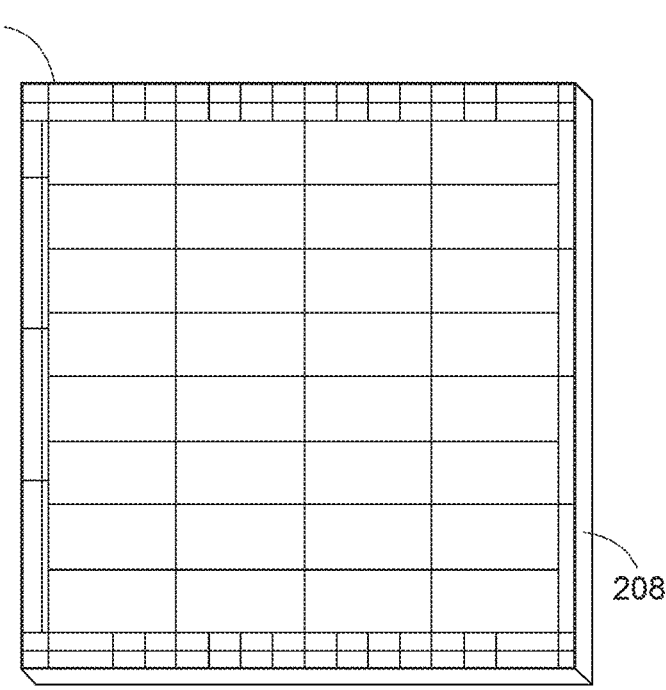
FIG. 2A
PRIOR ART
FIG. 2B
PRIOR ART

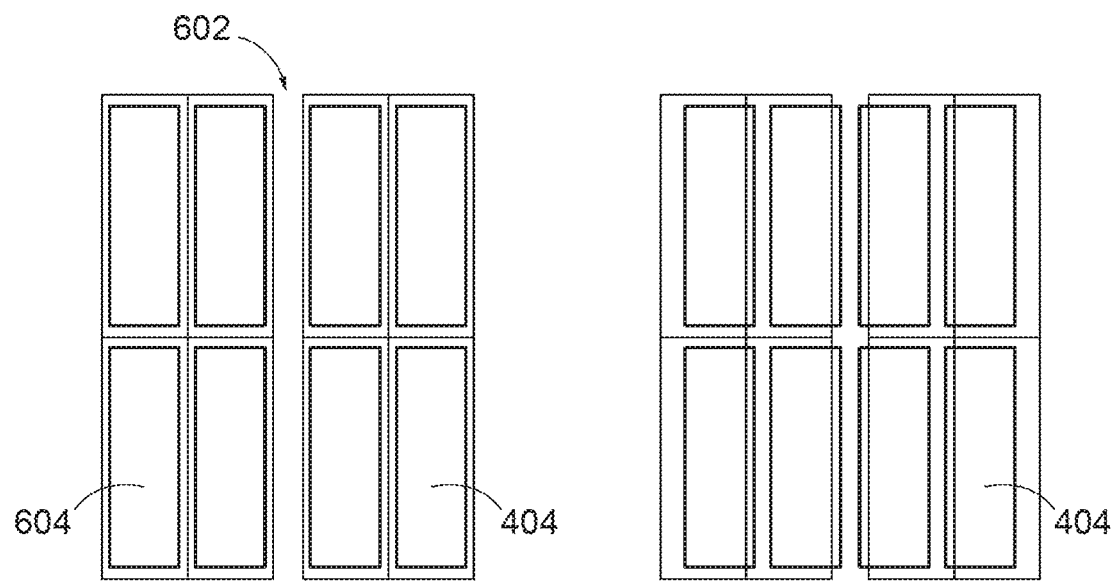
FIG. 6A
PRIOR ART
FIG. 6B
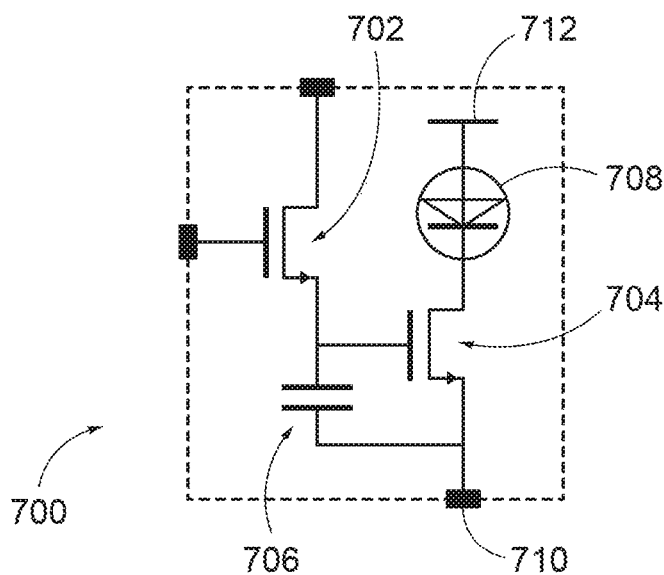
FIG. 7

LARGE AREA DISPLAY AND METHOD FOR MAKING SAME

STATEMENT OF RELATED CASES

This case claims priority to U.S. Provisional Patent Application Ser. No. 62/398,329 filed on Sep. 22, 2016, which is incorporated herein by reference in its entirety.

FIELD OF THE INVENTION

The present invention relates to microdisplays in general, and, more particularly, to a method for making an active-matrix organic light-emitting diode (AMOLED) microdisplay that provides super-resolution and is larger than possible using conventional production methods.

BACKGROUND OF THE INVENTION

Immersive head mounted displays (HMDs) in which a virtual reality (VR) or an augmented reality (AR) is displayed to a user include applications in outdoor activities (e.g., hunting, fishing, bird watching), combat training, and video gaming, among others. Conventional immersive HMDs incorporate relatively large (e.g., 4 inches×2 inches), low-resolution displays similar to those found in smartphones, as well as off-the-shelf commercial lenses. Such displays place limitations on the size, configuration, and function of current HMDs. There is great interest in developing an OLED microdisplay panel that has high resolution and is 1.4 or more inches in size for supporting the needs of virtual reality (VR) headsets.

OLEDs are popular display devices because they are thin, provide low voltage operation, and high-resolution capabilities. The OLED is a self-emitting display device in which electrons and holes injected into organic material through an anode and a cathode are recombined to generate excitons, and light with a certain wavelength is emitted by the generated excitons. Thus, the OLED, unlike an LCD, does not require a separate light source, e.g., a backlight, and, thus, consumes less power while realizing a wide viewing angle and a high response speed.

OLEDs may be divided into a passive matrix type and an active matrix type depending on a driving method thereof. Recently, active matrix type OLEDs have been employed, due to their low power consumption, high precision, high response speed, wide viewing angle and small thickness, which make them ideal for VR applications. In such an active matrix type OLED, a pixel region for light emitting or display is formed on a substrate, and a non-pixel region is formed on the substrate surrounding the pixel region.

Pixels serving as the basic unit for image representation may be arranged in a matrix on the pixel region. Light emitting elements may include a first electrode, e.g., an anode, a light emitting layer and a second electrode, e.g., a cathode, stacked in that order, and may be provided for each of the pixels. The light emitting layer may be made of an organic material for generating red (R), green (G) and blue (B) colors, respectively. A transistor, e.g., a thin film transistor (TFT), may be connected to the light emitting elements and may be arranged for each of the pixels to separately control the pixels. Pads may be formed on the non-pixel region and may be electrically connected to the pixels. The electric signals generated from a driving circuit may be applied to the pixels through these pads.

High-resolution active matrix displays may include millions of pixels and sub-pixels that are individually addressed by the drive electronics. Each sub-pixel can have several semiconductor transistors and other IC components. Each OLED may correspond to a pixel or a sub-pixel. Generally, however, an OLED display consists of many OLED pixels, and each OLED pixel may have three sub-pixels associated with it, in which each sub-pixel may include red, green and blue color OLEDs or may emit white light, which be filtered to either red, green or blue.

The external driving circuit may be connected to the pads through, e.g., a flexible printed circuit (FPC), a chip on glass (COG) or a tape carrier package (TCP). The FPC and COG may be connected to the pads using an adhesive, e.g., an anisotropic conductive film (ACF). The present invention utilizes an anisotropic conductive film (ACF) flex circuit interconnect system which utilizes ACF to electrically couple control line conductors provided on a flex circuit to corresponding control pads to provide control signals to the electrodes on optically transparent conductive film from the driver circuit. ACFs are widely used in flat panel display technology as the interconnect between a circuit element and display elements. These films typically have low or no conductivity in the X-Y plane that typically has large dimensions compared to the thickness but have high conductivity along the third axis, often labeled the Z-axis. As a result, these are also sometimes referred to as Z-axis conducting films. The base film may consist of a thermoset plastic, a thermoplastic, a thermoplastic adhesive or a thermoset adhesive. The film provides a matrix for electrically conducting elements that are dispersed in the film that span the z-axis and provide the electrical conduction through the film. The anisotropy of the conductivity is the result of having the conducting elements in low enough concentration that they only infrequently touch to provide limited lateral conductivity. The conducting elements are typically small metal balls, metal coated polymer balls, or oriented thin metal rods.

A typical pixel array is formed from blocks of a few thousand pixels. The mask contains a single instance of this block, and by stepping the mask the equivalent of the block size, the pixel block can be repeated side by side on the surface of the wafer. Multiple dies can be formed on the wafer and in some cases, multiple die patterns can be included in a single reticle to reduce the cost of the reticle set. The circuitry that surrounds the pixel is then added to complete the device. Using this method, a single mask can be used to manufacture large area devices.

In a method of manufacturing the active matrix type OLED, the TFT and the pad may be formed on the pixel region and the non-pixel region of the substrate, respectively. Then, a planarizing layer may be formed on the overall surface of the substrate so as to cover the TFT and the pad. The planarizing layer may then be patterned so as to expose a portion of the TFT and the pad, and a light emitting element may be formed on the planarizing layer in the pixel region so as to connect with the TFT.

The planarizing layer may be made of an organic material, e.g., acryl, and may be relatively thick in order to remove a step due to a height difference between the pixel region and the non-pixel region. However, the thicker the planarizing layer becomes, the more a height difference between the pad of the non-pixel region and the planarizing layer increases. Therefore, conductive balls of the ACF may not be sufficiently compressed when connecting, e.g., the FPC and COG to the pads. Thus, contact failure may occur between the pads and the FPC and COG.

There are generally two different types of AMOLED displays, namely a bottom emission organic light emitting diode (OLED) and a top emission OLED. In a bottom emission OLED, the OLED area shares co-planar space with associated TFTs and capacitors. That is, the OLED area typically is not stacked or overlapped with the TFT(s) and or capacitor(s). Light is generally emitted from a transparent or semi-transparent bottom electrode and passes through a transparent substrate. In a top emission OLED, light is emitted through the top surface of the display. Thus, a top emission OLED may place the OLED light-emitting area above or overlapping one or more TFTs and/or capacitors. A planarization layer may separate the OLED light-emitting area from the TFTs and/or capacitors.

Conventional solutions are based on display technology used for mobile phones that employ organic light-emitting diodes (OLED) on glass substrates and use thin-film-transistor (TFT) circuits on glass for pixel drivers. These solutions are limited in the resolution they can achieve to about 600 ppi today with future capability extending to perhaps 1000 ppi. It has been shown that for a realistic visual experience it will be necessary to provide 1500 to 2500 ppi or more in a panel size of at least 50 mm per side. Technical and production issues will make this very difficult to achieve using TFT on glass for the backplane driver. For one thing, the low mobility of TFT devices dictates rather large feature sizes to adequately drive an OLED pixel. Second, the lithography equipment used to pattern the large glass sheets that form the substrates for mobile display panels are limited to resolving feature sizes of greater than 1.5 microns. Both of these aspects work against the pixel miniaturization needed to achieve a high pixel per inch (PPI) resolution.

Some alternative solutions include microdisplay panels, such as those produced by eMagin, which routinely provide better than 3000 ppi resolution. These displays are built with OLED on single-crystal silicon substrates. The high mobility of silicon transistors enable small pixel circuits for driving the OLED diodes resulting in the very high PPI displays. In addition, the patterning of the silicon backplanes is done at the silicon foundry using conventional semiconductor lithography tools which can resolve feature sizes of less than 100 nm. However, the size of panels that can be built this way is limited to about 25 mm per side due to the exposure size limitations of modern semiconductor lithography equipment. The maximum field size for a typical lithography tool is 26×33 mm. As a result the OLED-on-silicon technology that can provide high resolution cannot easily achieve the large display panel sizes (>50 mm per side) that are optimal for VR headsets.

The need for a process that provides near-to-eye virtual reality or augmented reality microdisplays having display assemblies with light-emitting portions providing higher pixel densities (e.g. 1,500 ppi-2,500 ppi or more) and larger panel size (at least 50 mm per side) remains unmet in the prior art.

SUMMARY OF THE INVENTION

The present invention cures the deficiencies in the prior art by providing a method to implement a backplane design that is larger than possible with a single exposure of conventional silicon lithography tools while minimizing the burden and cost of the sub-block design.

The preferred embodiment includes an organic light-emitting diode (OLED) display device comprising a single crystal substrate, an interconnect region having a sub-pixel driving array disposed on the single crystal substrate, wherein the sub-pixel driving array includes two or more metal layers, a plurality of signal lines, a plurality of wiring pads, and a plurality of sub-pixel drivers, an anisotropic conductive film for connecting the plurality of sub-pixel drivers to the single crystal substrate, and a pixel array disposed on the single crystal substrate, wherein the pixel array includes an organic light-emitting diode layer having a plurality of organic light-emitting diodes disposed in respective sub-pixels and connected with the respective sub-pixel drivers. The plurality of pads are attached to the dual metal layers by the anisotropic conductive film. The pixel array includes a high pixel per inch arrangement configured in an active matrix. A single reticle is used to define the pixel array and wiring pads. The pixel array includes two transistors and an inverted organic light-emitting diode stack. At least one transistor is a high voltage n-channel metal-oxide silicon (NMOS) device or a lateral double-diffused metal-oxide-silicon (LDMOS) device. The pixel array has a resolution of at least 2,000 pixels per inch. The OLED display device has a panel size of at least 35 mm per side. The pixel array includes an offset OLED emitter array patterned over a stitched silicon pixel array.

In another embodiment, a display panel is provided having a plurality of sides, comprising at least one crystal substrate, an organic light-emitting layer deposited on the crystal substrate, and a plurality of organic light-emitting diode pixels arranged in an array on the organic light-emitting layer and having a combined resolution of at least 2,000 pixels per inch, wherein at least one side of the panel is greater than 35 mm.

In yet another embodiment, a method of fabricating a display device using a single reticle having a primary sub-block and two secondary sub-blocks is provided, comprising forming a single crystal substrate, depositing an interconnect region having a sub-pixel driving array on the single crystal substrate using the two sub-blocks of the reticle, wherein the sub-pixel driving array includes two or more metal layers, a plurality of signal lines, a plurality of wiring pads, and a plurality of sub-pixel drivers, bonding the plurality of sub-pixel drivers to the single crystal substrate by an anisotropic conductive film, and forming a pixel array on the single crystal substrate using the primary sub-block of the reticle, wherein the pixel array includes an organic light-emitting diode layer having a plurality of organic light-emitting diodes disposed in respective sub-pixels and connected with the respective sub-pixel drivers, wherein the pixel array includes an offset OLED emitter array patterned over a stitched silicon pixel array. The method further comprising attaching the plurality of pads to the dual metal layers by the anisotropic conductive film. The pixel array includes a high pixel per inch arrangement configured in an active matrix. A single reticle is used to define the pixel array and wiring pads. The pixel array includes two transistors and an inverted organic light-emitting diode stack. At least one transistor is a high voltage n-channel metal-oxide silicon (NMOS) device or a lateral double-diffused metal-oxide-silicon (LDMOS) device. The pixel array has a resolution of at least 2,000 pixels per inch. The display device has a panel size of at least 35 mm per side.

BRIEF DESCRIPTION OF THE DRAWINGS

FIG. 1A depicts a conventional mobile display panel used in virtual reality applications in accordance with the prior art.

FIG. 1B is a schematic cross-sectional view of the mobile display panel of FIG. 1A.

FIGS. 2A and 2B is a plan view of a large area silicon backplane formed using a conventional stitching process.

FIG. 6A is a schematic view showing a pixel array arrangement having a vertical stitching boundary in accordance with the patterning method used to form the large format display device of the present invention.

FIG. 6B is a schematic view showing a pixel array arrangement having a non-stitched OLED pattern in accordance with the patterning method used to form the large format display device of the present invention.

FIG. 7 is a schematic view of a pixel circuit in accordance with the illustrative alternative of the present invention.

DETAILED DESCRIPTION

Figure 3:
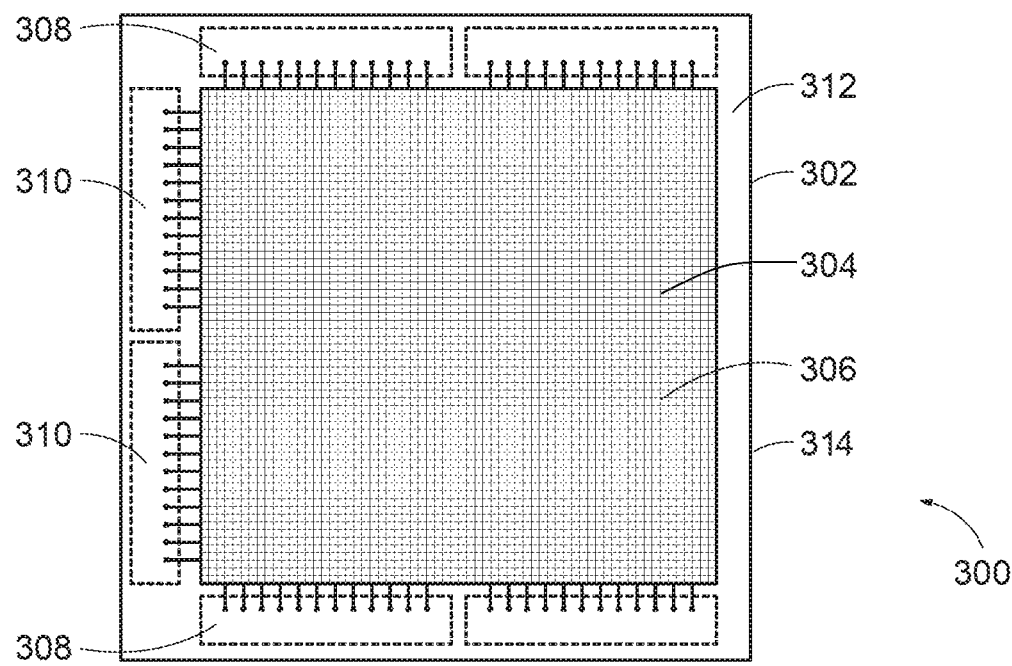
FIG. 3 is a schematic view showing a configuration for a large format display in accordance with the illustrative embodiment of the present invention.

FIGS. 1A and 1B illustrates a conventional mobile display panel 100 used in virtual reality applications. The panel 100 consists of a polysilicon thin-film-transistor (TFT) 104 on glass backplane 102, with an OLED layer 106 deposited on top. Preferably, the OLED layer 106 is a side-by-side color architecture with each color stack evaporated through a fine metal mask. Separate driver integrated circuits (ICs) 108 are attached to the glass substrate using an anisotropic adhesive film (ACF) layer 110. Separate flexible printed circuits (FPCs) 112 are attached to the glass substrate using an anisotropic adhesive film (ACF) layer 114.

FIGS. 2A and 2B illustrates a conventional silicon stitching method 200 used to build semiconductor chips 202 at a foundry that are larger than possible with existing patterning tools. The chip 202 is partitioned into sub-blocks 204, which must fit into a single reticle 206. Each sub-block 204 is patterned across the wafer 208 in sequence. Method 200 is limited to fabricating specialty devices due to high production costs. As shown, the stitching method requires partitioning the chip design into a collection of sub-blocks 204 that all fit onto a single set of reticles 206. During wafer patterning these sub-blocks 204 are exposed sequentially at specific locations in order to reconstruct the complete design at multiple positions across the wafer. Method 200 is costly due to the large number of steps necessary to expose various sub-blocks for each mask layer in the process. For example, if chip design is partitioned into 10 sub-blocks the total patterning time will take 10 times as long as it would take to expose the full design all at once. The patterning throughput will then either be 10 times longer or the number of lithography tools increased by 10 times. As such, cost of production is significantly increased. Additionally, large upfront engineering cost are necessary to create partitioned designs that fit one reticle set. Furthermore, separate layout design rules are required for sub-field boundaries that add to layout complexity and increase overall size of architecture as compared to a non-stitched version. Finally, stitching boundaries result in optical artifacts due to displacement of pixels along stitching line as illustrated in FIG. 6A.

FIG. 3 illustrates an exemplary view of a panel architecture 300 as proposed by the present invention. Panel architecture 300 includes an OLED emitting layer 304 deposited on a single crystal substrate 302 that is used for implementing the backplane pixel array 306. Separate column driver chips 308 and row drivers chips 310 are attached to the silicon substrate 302 using an ACF layer 312. In some embodiments, a plurality of anisotropic conductive balls (not shown) are formed having the same anisotropic properties as an anisotropic conducting film. The OLED display device contemplated by the present invention resolution of at least 2,000 pixels per inch and a panel size of at least 35 mm per side.

Figures 4A, 4B:
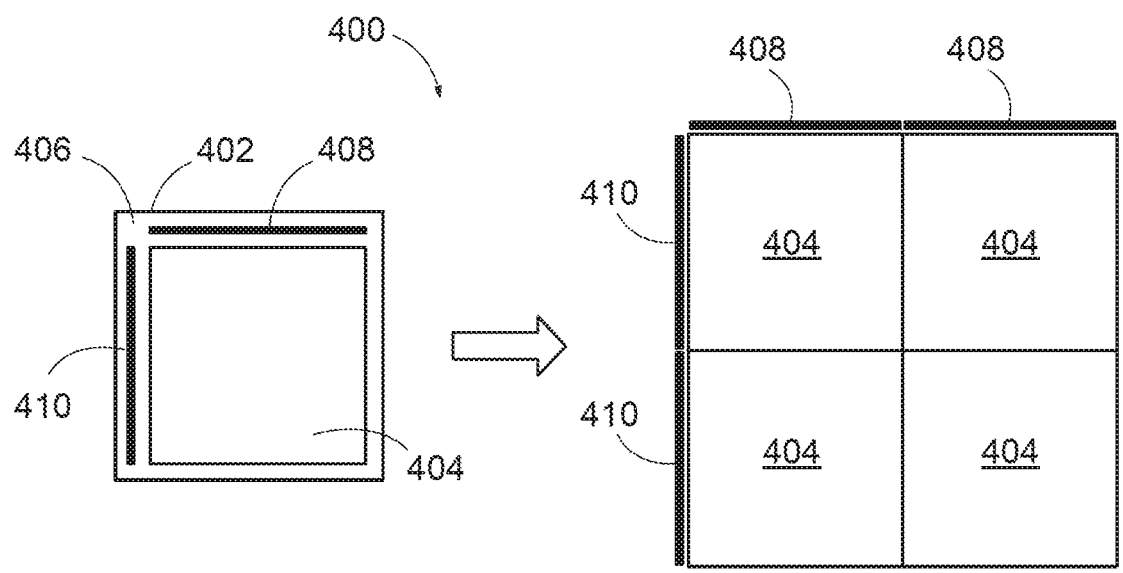
FIG. 4A depicts an enlarged view of a single reticle in accordance with a patterning method of the present invention used to form the large format display device of FIG. 3.
FIG. 4B depicts an enlarged view of a patterned array die in accordance with the patterning method of FIG. 4A.

FIGS. 4A and 4B illustrate an exemplary patterning method 400 provided by the present invention. A single reticle 402 is used, which contains primarily the array sub-block 404 and, secondarily, a pair of small sub-blocks 408 and 410 for the interconnect region 406. In particular, reticle 402 is partitioned into primary sub-block (pixel array) 404 and two secondary sub-blocks 408 and 410 that form the interconnect region 406 for the ACF attachment layer 312 of external driver chips as shown in FIG. 3. Pixel array 404 is formed on a single crystal wafer 314, (as illustrated in FIG. 3), in this concept, which also serves as the substrate 302 for the OLED emitters and the external driver chips. A reduced cost silicon wafer can be used as the substrate because the pixel array 404 can be built with NMOS only transistors as illustrated in FIG. 7, resulting in a simplified twelve mask wafer process. In addition, the interconnect regions 406 are formed using only two metal layers and two via layers, further reducing the cost of stitching these sub-blocks which each only require four exposures. As such, reticle masks and patterning exposures is greatly reduced compared to conventional stitching approaches.

Figure 5:
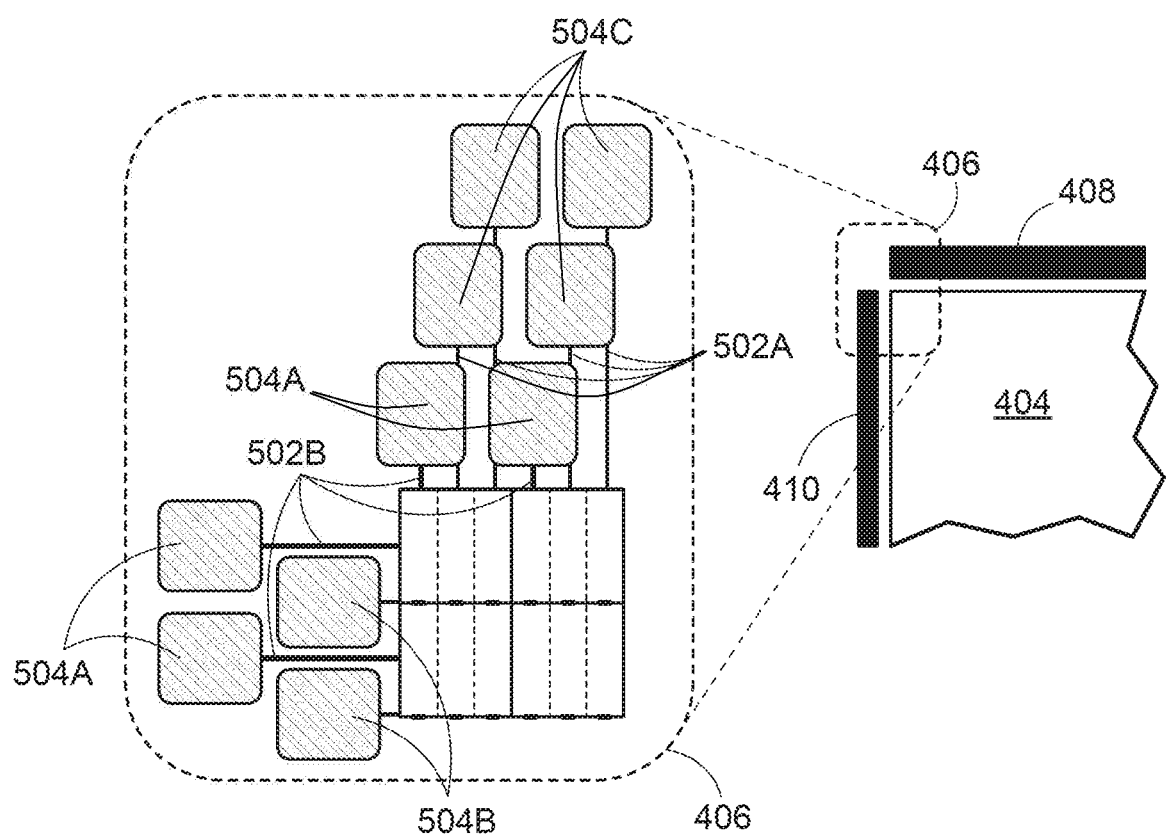
FIG. 5 depicts an enlarged view of an interconnect region of a pixel array in accordance with the patterning method of FIG. 4A.

FIG. 5 illustrates an exploded view of the interconnect region 406 of FIGS. 4A and 4B which consists of two metal layers used to implement data line wiring tracks 502A and select pad wiring tracks 502B and ACF attachment pads 504, including select pads 504A, ground pads 504B, and data line pads 504C in order to achieve higher pixel density with existing ACF interconnect technology. As shown in FIG. 5, dual metals allow pads 504 to be expanded directionally away from pixel array 404 so as to maintain large pad area while still connecting to high-density column array. In some embodiments, connections can be made to both sides of the pixel array to further increase working pixel density achieved. In some embodiments, the chips and 308 and 310 are mounted to a circuit film (not shown) which is adhered to the pad through the ACF layer 312. These films on which the chips are mounted may be formed of tape carrier package TCP or chip-on-film COF.

FIGS. 6A and 6B illustrate use of a large field stepper for OLED emitter patterning to overlay silicon pixel cells to avoid optical artifacts due to stitching. As shown in FIG. 6A, stitching boundary 602 at pixel array 404 can result in an optical artifact if it is matched at OLED emitter pattern 604. Alternatively, pixel array pitch can be increased across the full pixel array 404 to achieve a uniform appearance. In the present invention, as illustrated in FIG. 6B, OLED emitter 604 pitch is maintained at a uniform level across entire display by offsetting it slightly over silicon pixel cells. This is achieved when only one, or in some embodiments, two stitching boundaries exist across the pixel array 404 which can be accommodated by design rule margins. A large field stepper is available for use in defining OLED emitter patterns up to 50 mm on a side since the resolution required for the OLED patterns is much lower than necessary for silicon device patterns.

FIG. 7 illustrates an exemplary design for pixel circuit 700 that can be implemented in a simplified negative channel metal-oxide-semiconductor (NMOS) logic process. The pixel circuit 700 uses inverted OLED diode architecture. The pixel circuit 700 includes thin film transistors (TFTs) 702 and 704, a capacitor 706, an OLED 708, which is the light-emitting element. OLED 708 has a common anode 712 and its cathode connected to a ground potential GND 710. In some embodiments, alternative OLED architectures may be employed.

In some embodiments, various changes may be made in the transparent materials or number of OLED layers, all while preserving the function of the present invention as described herein. The organic light emitting devices may be either top or bottom emitting. Further, it may be appropriate to make various modifications in materials of the present invention, or in the mode of operation of a preferred embodiment of the present invention. Thus, it will be apparent to those skilled in the art after reading this disclosure that various modifications and variations of the can be made in the construction and configuration of the present invention without departing from the scope or spirit of the invention and that the scope of the present invention is to be determined by the following claims.

What is claimed is:

1. An organic light-emitting diode (OLED) display device comprising:
   a single crystal substrate;
   an array of reticle patterns disposed on the single crystal substrate, wherein each reticle pattern includes:
   (i) a primary sub-block that contains a pixel array, wherein each pixel in the pixel array includes a pixel circuit; and
   (ii) an interconnect region that includes a plurality of wiring pads; and
   an OLED emitting layer comprising an OLED emitter array;
   wherein the reticle patterns of the array are substantially identical and stitched together to collectively define a backplane pixel array that includes the plurality of pixel arrays and at least one stitching boundary;
   wherein the OLED emitting layer is disposed on the backplane pixel array and each OLED emitter of the OLED emitter array is electrically connected to a different pixel circuit of the backplane pixel array; and
   wherein the OLED emitter array has uniform pitch across the entire display device.

2. The OLED display device of claim 1 further comprising a first driver chip that is electrically connected with at least one wiring pad of the plurality via an anisotropic conductive film.

3. The OLED display device of claim 1 wherein the backplane pixel array comprises an active matrix pixel array.

4. The OLED display device of claim 1 wherein each pixel in the array includes a first transistor and a second transistor, and wherein one of the first and second transistors is configured to drive an OLED of the OLED emitter array.

5. The OLED display device of claim 4 wherein at least one of the first transistor and second transistor is a high voltage n-channel metal-oxide silicon (NMOS) device or a lateral double-diffused metal-oxide-silicon (LDMOS) device.

6. The OLED display device of claim 1 wherein the backplane pixel array has a resolution of at least 2,000 pixels per inch.

7. The OLED display device of claim 1 having a panel size of at least 35 mm per side.

* * * * *